United States Patent
Kawakami et al.

(10) Patent No.: US 8,564,186 B2
(45) Date of Patent: Oct. 22, 2013

(54) LIGHT SOURCE APPARATUS HAVING A SOLID LIGHT SOURCE ELEMENT AND A PHOSPHOR

(75) Inventors: Yasuyuki Kawakami, Tokyo (JP); Takahiro Matsumoto, Tokyo (JP); Yoshiaki Yasuda, Tokyo (JP); Koichi Okamoto, Fukuoka (JP)

(73) Assignees: Stanley Electric Co., Tokyo (JP); Koichi Okamoto, Fukuoka-Shi (JP)

( * ) Notice: Subject to any disclaimer, the term of this patent is extended or adjusted under 35 U.S.C. 154(b) by 107 days.

(21) Appl. No.: 13/232,034

(22) Filed: Sep. 14, 2011

(65) Prior Publication Data

US 2012/0063117 A1   Mar. 15, 2012

(30) Foreign Application Priority Data

Sep. 15, 2010   (JP) .................................. 2010-207217

(51) Int. Cl.
*F21V 9/16*   (2006.01)

(52) U.S. Cl.
USPC ............. 313/501; 313/504; 313/506; 445/23; 445/24; 362/84

(58) Field of Classification Search
CPC ............ H01L 33/50; H01L 24/16; F21K 9/00
USPC ........... 313/500–512; 257/40; 362/84; 438/1, 438/14, 49
See application file for complete search history.

(56) References Cited

U.S. PATENT DOCUMENTS

2008/0048936 A1 *   2/2008   Powell et al. ................... 345/55

FOREIGN PATENT DOCUMENTS

| JP | 2001-077433 | 3/2001 |
| JP | 2006-196490 | 7/2006 |
| JP | 2007-157766 | 6/2007 |

OTHER PUBLICATIONS

Wang et al., Investigation of the Mechanical Properties of P-doped Si-H films, 2008, Proc of SPIE vol. 6984, pp. 698411-1 to 698411-3.*

* cited by examiner

*Primary Examiner* — Tracie Y Green
(74) *Attorney, Agent, or Firm* — Rankin, Hill & Clark LLP (57) ABSTRACT

Provided is a light source apparatus having a phosphor layer which is subjected to a light beam of a predefined wavelength emitted from a solid light source element as an excitation light beam and which generates fluorescent beam by being excited by the incident excitation light beam and emits the fluorescence beam to outside, and a metal layer which is joined to a predefined surface among outer surfaces of the phosphor layer except an incident surface of the excitation light beam and an outgoing surface of the fluorescence beam for converting excitons excited from a section of the phosphor layer close to the predefined surface into a light beam via surface plasmon polaritons. The light beam converted from the excitons via the surface plasmon polaritons is emitted out of the outgoing surface of the phosphor layer together with the fluorescence beam.

11 Claims, 4 Drawing Sheets

LIGHT SOURCE APPARATUS HAVING A SOLID LIGHT SOURCE ELEMENT AND A PHOSPHOR

BACKGROUND OF THE INVENTION

1. Field of the Invention

The present invention relates to a light source apparatus having a solid light source element and a phosphor.

2. Description of the Related Art

Conventionally, there has been known a light source apparatus in which a light source element such as a LED chip or the like is covered by a translucent resin mold member having a phosphor (for example, refer to Japanese Patent Laid-open No. 2001-77433). The conventional light source apparatus emits to the outside of the translucent rein mold member a light beam of a combination color combined from a light beam emitted from the solid light source element and a fluorescence beam generated according to the excitation of the phosphor by the light beam emitted from the solid light source element.

The light source apparatus mentioned above has been applied as a light source in lighting equipments, headlamps of a vehicle and the like in rapid progress, thus, it has been required that the light source apparatus emit a light beam of a high intensity in a high efficiency. In response to the requirement, there have been disclosed in, for example, Japanese Patent No. 4140606 and Japanese Patent Laid-open No. 2007-157766, arts for improving light-emitting intensity and light-emitting efficiency of a GaN light-emitting semiconductor element used as the solid light source element.

In the light source apparatus disclosed in Japanese Patent Laid-open No. 2001-77433, in order to make the light source apparatus emit the combination light combined from the light beam emitted from the solid light source element and the fluorescence beam from the phosphor in a high efficiency and a high output, it is necessary to improve not only the light-emitting intensity and light-emitting efficiency of the solid light source element but also the light-emitting intensity and light-emitting efficiency of the fluorescence beam from the phosphor.

However, generally the light-emitting intensity of the fluorescence beam from the phosphor has a saturation characteristic relative to the light-emitting intensity of the solid light source element (incident intensity of an excitation light beam to the phosphor). Therefore, when the light-emitting intensity of the solid light source element reaches to a certain extent, even though the light-emitting intensity of the solid light source element increases, the light-emitting intensity of the fluorescence beam from the phosphor will not increase particularly.

The reasons why the light-emitting intensity of the phosphor will become saturated may be given as the follows: an exciton excited from the phosphor releases heat (become a phonon) when returning to the ground state via a non-radiation process, the released heat warms up the phosphor to have a temperature rise which deteriorates the light-emitting efficiency of the phosphor; or the excitation density (the amount of excitons generated from a unit volume of the phosphor) becomes high to give birth to an excitation saturation (saturation of the excitation density) which deteriorates the light-emitting efficiency of the phosphor Therefore, in order to improve the light source apparatus to a high efficiency and a high output, it is desired to inhibit the above-mentioned reasons as much as possible.

SUMMARY OF THE INVENTION

The present invention has been accomplished in view of the aforementioned problems, and it is therefore an object of the present invention to provide a light source apparatus capable of inhibiting excitons excited from a phosphor from returning to the ground state in a non-radiation process (inhibiting excitons from becoming phonons) and inhibiting excitation saturation from occurring, and consequently improving a light-emitting efficiency and a light-emitting intensity thereof.

To attain an object described above, the light source apparatus of the present invention includes a solid light source element which emits a light beam of a predefined wavelength, a phosphor layer which is subjected to the light beam emitted from the solid light source element as an excitation light beam and is excited by the incident excitation light beam to generate a fluorescence beam of a longer wavelength than the excitation light beam and emit the fluorescence beam to the outside, and a metal layer which is joined to a predefined surface among outer surfaces of the phosphor layer except an incident surface of the excitation light beam and an outgoing surface of the fluorescence beam for converting excitons excited in the phosphor layer close to the predefined surface into a light beam via surface plasmon polaritons. The light beam converted from the excitons via the surface plasmon polaritons is emitted out of the outgoing surface of the phosphor layer together with the fluorescence beam (First aspect).

According to the light source apparatus of the first aspect of the present invention, in addition to the fluorescence beam (specifically, the fluorescence beam generated when the excitons excited in the phosphor layer by the excitation light beam emitted into the phosphor layer return to the ground state via a radiation process), the light beam converted from the excitons via the surface plasmon polaritons is generated in the phosphor layer.

The surface plasmon polaritons are generated through the coupling of the excitons generated in the phosphor layer close to a joint surface (boundary surface) between the phosphor layer and the metal layer with the surface plasmon generated at the joint surface. According to the present invention, the surface plasmon polaritons are converted into a light beam (photon), and the light beam is emitted to outside from the outgoing surface of the phosphor layer together with the fluorescence beam.

In the first aspect of the present invention, in addition to the normal radiation process and non-radiation process, the behavior of the excitons excited in the phosphor layer also includes the process of generating the surface plasmon polaritons by coupling the excitons with the surface plasmon generated at the joint surface between the phosphor layer and the metal layer (hereinafter, referred to as the surface plasmon process where appropriate) as mentioned in the above.

Therefore, in all the excitons excited in the phosphor layer, the amount of excitons which generate heat (phonon) by returning to the ground state via the non-radiation process may be reduced relatively, and consequently, it is possible to relatively increase the amount of excitons converted into the light beam via the radiation process or the surface plasmon process.

According to the formation of the surface plasmon polaritons by coupling the excitons with the surface plasmon, it is possible to make the amount of excitons present in a unit volume of the phosphor layer per unit time, namely the excitation density less than the case where the surface plasmon process does not occur (specifically, only the radiation process and the non-radiation process occur in the phosphor layer). Thereby, it is possible to improve the upper limit of intensity of the excitation light beam possible to enter into the phosphor layer without having the occurrence of excitation saturation where the excitation density is saturated.

Thus, according to the light source apparatus of the first aspect of the present invention, it is possible to inhibit the excitons excited from the phosphor from returning to the ground state in the non-radiation process (inhibit the excitons from becoming phonons) and inhibit the excitation saturation from occurring, and consequently to improve the light-emitting efficiency and the light-emitting intensity of the light source apparatus.

In the first aspect of the present invention, it is acceptable that if the phosphor layer can generate the excitons close to the joint surface (the boundary surface) to the metal layer. More specifically, for example, it is desired that the phosphor layer is composed of nanocrystalline silicon (Second aspect).

The phosphor layer composed of the nanocrystalline silicon can not only generate fluorescence beam from the incident excitation light beam according to the radiation process but also can generate more excitons close to the joint surface to the metal layer. Therefore, it is possible to couple more excitons generated in the phosphor layer with the surface plasmon rapidly to form the surface plasmon polaritons. Consequently, it is possible to reduce effectively the amount of excitons which will become heat via the non-radiation process, and thereby to improve the light-emitting efficiency in the phosphor layer effectively.

The phosphor layer composed of the nanocrystalline silicon can emit light beams in red, green and the like in a wide wavelength range, and for example, if a GaN light-emitting semiconductor element or the like emitting a blue light beam is used as the solid light source element, it is possible to turn the combination color of a light beam combined from the light beam emitted from the solid light source element and the fluorescence beam emitted from the phosphor layer into a white one. Consequently, it is possible to provide a white light source apparatus capable of emitting a white light beam of high intensity in high efficiency.

The following embodiments, for example, may be given as more specific examples of the phosphor layer composed of the nanocrystalline silicon as mentioned in the above.

It is acceptable that the phosphor layer is composed of the nanocrystalline silicon which is prepared by anodizing a silicon substrate (Third aspect).

It is acceptable that the phosphor layer is composed of the nanocrystalline silicon which is prepared by etching a polysilicon (Fourth aspect). Herein, as an etching agent, hydrofluoric acid, oxygen gas or the like may be used.

It is also acceptable that the phosphor layer is composed of the nanocrystalline silicon which is prepared by ion-implanting silicon into a silicon dioxide film (Fifth aspect).

According to the third aspect up to the fifth aspect, it is easy to prepare the phosphor layer from the nanocrystalline silicon.

In the first aspect up to the fifth aspect of the present invention, it is desirable that the metal layer is composed of such sort of metal that the frequency of a surface plasmon generated at a joint surface of the metal layer to the phosphor layer is equivalent to the frequency of the fluorescence beam (Sixth aspect).

In the sixth aspect of the present invention, the description that the frequency of the surface plasmon is equivalent to the frequency of the fluorescence beam is not limited to the meaning that the frequency of the surface plasmon is strictly the same as the frequency of the fluorescence beam; it is allowed to have some differences present between the frequency of the surface plasmon and the frequency of the fluorescence beam if they are in such a range that the excitons excited in the phosphor layer is able to couple with the surface plasmon.

According to the sixth aspect of the present invention, it is possible to accelerate effectively the coupling of the excitons generated in the phosphor layer close to the joint surface to the metal layer with the surface plasmon. Consequently, it is possible to reduce effectively the amount of excitons which will become heat via the non-radiation process, and thereby to improve the light-emitting efficiency in the phosphor layer effectively.

Since it is easy for the excitons generated in the phosphor layer close to the joint surface to the metal layer to couple with the surface plasmon, it is possible to further reduce the excitation density in the phosphor layer. Consequently, it is possible to improve the upper limit of intensity of the excitation light beam possible to enter into the phosphor layer without having the occurrence of the excitation saturation.

In the first aspect up to the sixth aspect of the present invention, it is desirable that the joint surface of the metal layer to the phosphor layer is a coarse surface (Seventh aspect).

According to various experiments conducted by the inventors of the present application, by forming the joint surface of the metal layer to the phosphor layer into a coarse surface, it is possible to accelerate the conversion of the surface plasmon polaritons into the light beam emitting out from the phosphor layer. Thereby, it is possible to improve effectively the light-emitting efficiency of the phosphor layer and the intensity of the light beam emitting out from the phosphor layer.

As an example of the coarse surface, a coarse surface of a grain structure may be given.

In the seventh aspect of the present invention where the joint surface of the metal layer to the phosphor layer is formed into a coarse surface, it is preferable that the metal layer is joined to the phosphor layer by evaporating a metal constituting the metal layer on the phosphor layer (Eighth aspect).

According to the eighth aspect of the present invention, by appropriately setting the evaporation speed of the metal to the phosphor layer, it is possible to form the coarse surface adaptable to the conversion of the surface plasmon polaritons to a light beam emitting out from the phosphor layer, and meanwhile to join the metal layer to the phosphor layer.

In the first aspect up to the eighth aspect of the present invention, it is desirable that the solid light source element is mounted on a bottom surface of a recess portion formed in a base plate, and the phosphor layer and the metal layer are fixed on a wall surface of the recess portion formed in the base plate with the metal layer intervened between the phosphor layer and the base plate (Ninth aspect).

According to the ninth aspect of the present invention, it is possible to provide the light source apparatus of a compact package structure having the solid light source element, the phosphor layer and the metal layer mounted integrally in the recess portion of the base plate.

DETAILED DESCRIPTION OF THE PREFERRED EMBODIMENTS

First Embodiment

Hereinafter, a first embodiment according to the present invention will be described with reference to the drawings of FIG. 1 to FIG. 5 as a fundamental embodiment.

Figure 1:
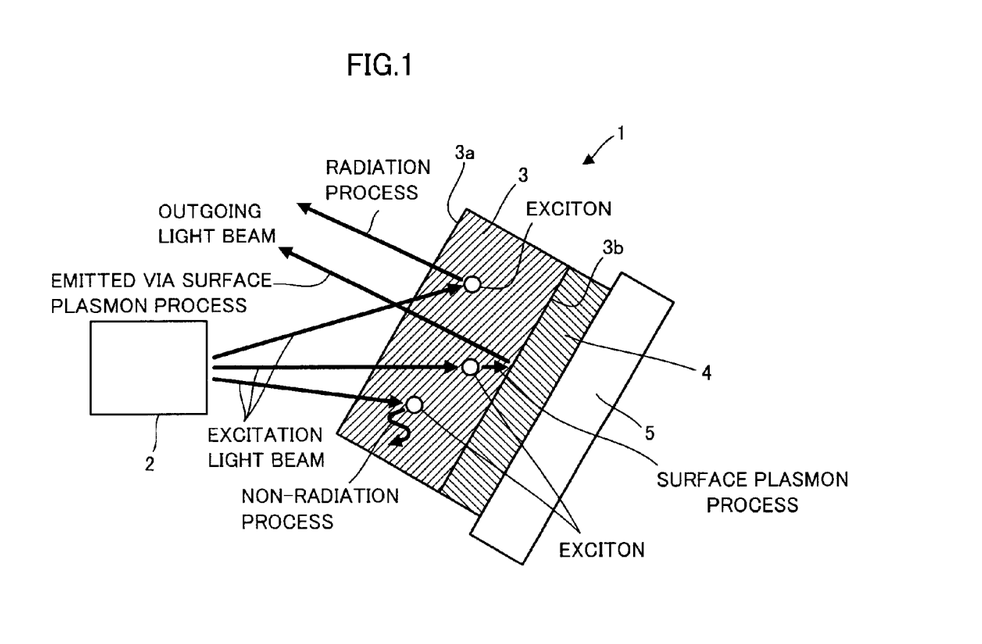
FIG. 1 is a diagram illustrating a fundamental structure of a light source apparatus according to a first embodiment of the present invention.

FIG. 1 illustrates a fundamental structure of a light source apparatus 1 of the present embodiment. The light source apparatus 1 includes a solid light source element 2, a phosphor layer 3, and a metal layer 4 joined to the phosphor layer 3 as fundamental elements. In the light source apparatus 1 illustrated in the drawing, the phosphor layer 3 and the metal layer 4 are mounted on a base plate 5 such as a silicon substrate or the like.

The solid light source element 2 is a light source composed of a light-emitting semiconductor element, such as a light-emitting diode, a laser diode or the like. The solid light source element 2 emits a light beam of a predefined wavelength within a wavelength range, for example, from ultraviolet light to visible light. In the present embodiment, a light-emitting diode such as a GaN (Gallium Nitride) light-emitting semiconductor element or the like which emits a blue light beam is used as the solid light source element 2.

The phosphor layer 3 is a layer of phosphor which is subjected to a light beam emitted from the solid light source element 2 as an excitation light beam and excited by the excitation light beam to emit a fluorescence beam of a longer wavelength than the excitation light beam. In the phosphor layer 3 illustrated in the drawing, an outer surface 3a is disposed to face the solid light source element 2 with a distance therebetween in a direction oblique to the normal line of the outer surface 3a. The outer surface 3a of the phosphor layer 3 functions as an incident surface of the light beam (the excitation light beam) emitted from the solid light source element 2 to the phosphor layer 3 and also as an outgoing surface of a light beam generated in the phosphor layer 3.

As to be described hereinafter, the light beam generated in the phosphor layer 3 is combined from a light beam (fluorescence beam) generated in a radiation process by excitons excited by the excitation light beam emitted into the phosphor layer 3 and a light beam generated by the excitons in a surface plasmon process.

It is acceptable that the phosphor layer 3 may be composed of a material which can generate excitons capable of coupling with the surface plasmon occurred in a joint surface (boundary surface) to the metal layer 4 (specifically, excitons close to the joint surface), for example, from nanocrystalline silicon. To be more specific, in the present embodiment, the phosphor layer 3 is composed of, for example, hydrogen-terminated porous silicon having a nanocrystalline silicon structure.

The phosphor layer 3 composed of hydrogen-terminated porous silicon having a nanocrystalline silicon structure is prepared, for example, according to an anodization process to be described hereinafter.

Figure 2:
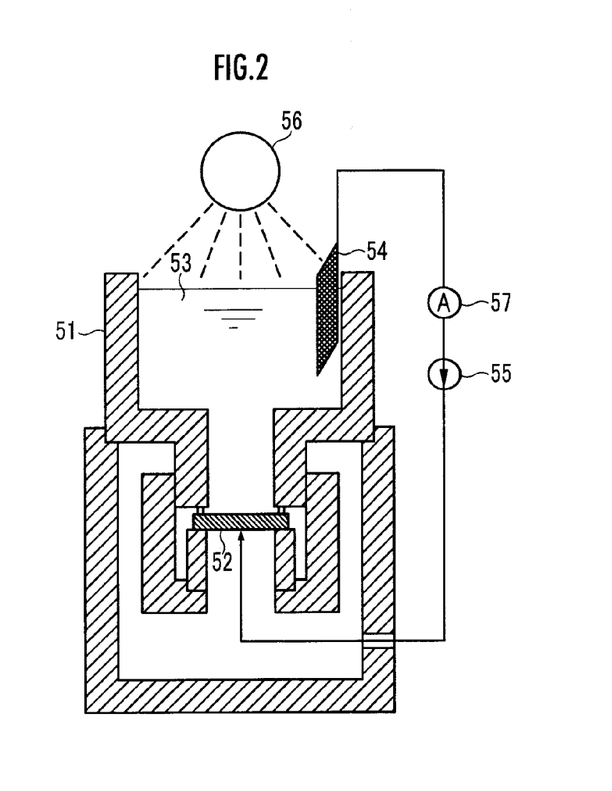
FIG. 2 is a diagram illustrating a production approach for producing a phosphor layer in the light source apparatus illustrated in FIG. 1.

Specifically, as illustrated in FIG. 2, an electrolyte 53 (for example, HF—$C_2H_5OH$ solution) was put into a Teflon (trademark) electrolytic cell 51, and a Si substrate 52 was disposed at the bottom of the electrolytic cell 51. After a mesh-shaped Pt cathode 54 was dipped in the electrolyte 53, a voltage was applied from a DC power source 55 between the Si substrate 52 and the Pt cathode 54, and a DC current about 1 to 500 mA/$cm^2$ was applied to the Si substrate 52 for 10 minutes to 13 hours. According thereto, the Si substrate 52 was anodized and a porous silicon film was obtained. In FIG. 2, the reference numeral 56 denotes a lamp and the reference numeral 57 denotes an ammeter.

In order to take the porous silicon film formed on the Si substrate 52 off from the Si substrate 52, a current of 500 mA/$cm^2$ to 2000 mA/$cm^2$ was applied to the Si substrate 52 for 0.1 to 1 second to take the porous silicon off from the Si substrate 52.

The free-standing porous silicon prepared as mentioned above will have a thickness about 1 μm/min if it is prepared by using the Si substrate 52 of p(100) and 1 to 10Ω·cm under a current density of 20 mA/$cm^2$. If HF—$C_2H_5OH$ solution (volume ratio HF:$C_2H_5OH$=0.1:1 to 1:0.1 approximately) is used as the electrolyte 53, as illustrated in FIG. 3, it is possible to prepare a porous silicon film having the outer surfaces of nanocrystalline silicon completely terminated by hydrogen atoms.

Figure 3:
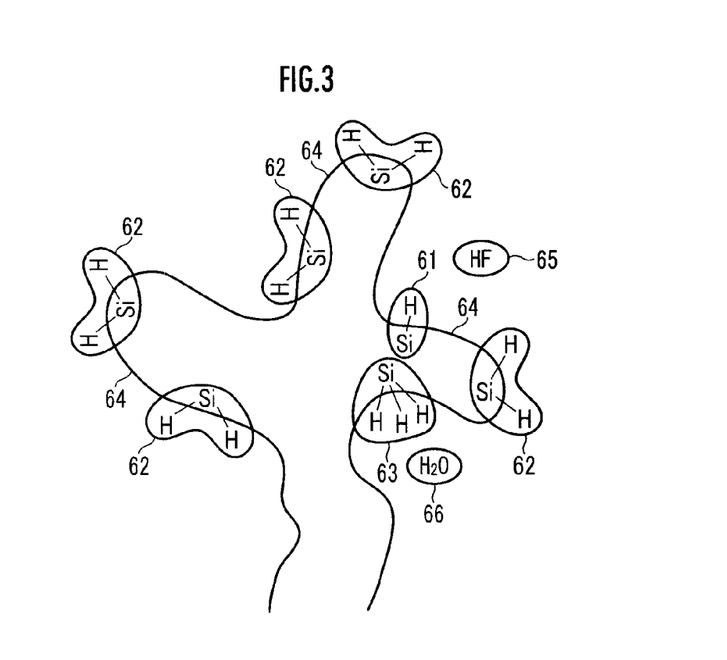
FIG. 3 is a diagram illustrating a composition of the phosphor layer in the light source apparatus illustrated in FIG. 1.

In FIG. 3, the reference numeral 61 denotes that the silicon is terminated by 1 hydrogen atom; the reference numeral 62 denotes that the silicon is terminated by 2 hydrogen atoms; and the reference numeral 63 denotes that the silicon is terminated by 3 hydrogen atoms. The reference numeral 64 denotes a silicon column; the reference numeral 65 denotes HF; and the reference numeral 66 denotes $H_2O$.

Referring back to FIG. 1, the metal layer 4 is a metal thin-film layer joined to a back surface 3b (the opposite surface to the outer surface 3a) of the phosphor layer 3. The metal layer 4 has functions of generating a light beam (phonons) from the excitons excited by the excitation light beam emitted into the phosphor layer 3 via surface plasmon polaritons to be described hereinafter.

As the types of metals constituting the metal layer 4, for example, metals of Au (Gold), Ag (Silver), Al (Aluminum), Cu (copper), Pt (platinum), Pb (Lead) and the like or an alloy thereof may be used generally. Each of the metals generates the surface plasmon of a wavelength intrinsic to the sort of metal in the joint surface (the boundary surface between the phosphor layer 3 and the metal layer 4) to the phosphor layer 3.

In the light source apparatus 1 of the present embodiment, in order to accelerate the coupling of the excitons excited in the phosphor layer 3 with the surface plasmon (to generate the surface plasmon polaritons), the sort of metal constituting the metal layer 4 is selected in such a condition that the intrinsic surface plasmon wavelength thereof is equal to or close to the wavelength of light beam (the fluorescence beam) generated from the excitons of the phosphor layer 3 in the radiation process.

More specifically, in the present embodiment, the wavelength of the fluorescence beam generated from the phosphor layer 3, for example, is set to vary from a wavelength of about 540 nm (the wavelength of green color) to a wavelength of about 640 nm (the wavelength of red color). Accordingly, as the material for the metal layer 4, Au which has an energy conversion value of the surface plasmon wavelength (=the surface plasmon wavelength×Planck's constant) equal to about 2.3 eV is used. The wavelength of the fluorescence beam generated from the phosphor layer 3 may be set to different wavelength by adjusting the size of grains in the nanocrystalline silicon constituting the phosphor layer 3.

The joint surface of the metal layer 4 to the phosphor layer 3 is configured to be a coarse surface so as to convert the surface plasmon polaritons generated in the joint surface into a light beam emitted out from the phosphor layer 3. In the present embodiment, the coarse surface has a grain structure.

It has been confirmed by the inventors of the present application according to various experiments that it is impossible to convert the surface plasmon polaritons into the light beam emitted out of the phosphor layer 3 if the size of grains in the coarse surface of a grain structure is smaller than 10 nm or greater than 100 nm. Thereby, in the present embodiment, the size of grains in the coarse surface of a grain structure is set in a range of 10 nm to 100 nm.

The metal layer 4 is set to have a thickness possible to make the surface plasmon polaritons generated in the joint surface of the metal layer 4 to the phosphor layer 3 to be converted into the light beam emitted out from the phosphor layer 3 effectively. Specifically, it has been confirmed by the inventors of the present application according to various experiments that it is difficult to convert the surface plasmon polaritons into the light beam emitted out of the phosphor layer 3 if the thickness of the metal layer 4 is thinner than 10 nm.

The reasons thereof may be considered as the following: if the metal layer 4 is thinner than 10 nm, interactions will occur between the surface plasmon polaritons generated in the joint surface of the metal layer 4 to the phosphor layer 3 and the surface plasmon polaritons generated in the opposite surface to the joint surface of the metal layer 4; therefore, it would be difficult to convert the surface plasmon polaritons generated in the joint surface of the metal layer 4 to the phosphor layer 3 into the light beam, or it would be difficult for the surface plasmon polaritons to be generated because the metal layer 4 is not formed into a smooth film but into a film distributed with islands. Thereby, in the present embodiment, the metal layer 4 is set to have a thickness of at least 10 nm.

In the present embodiment, the metal layer 4 was prepared by evaporating a metal constituting the metal layer 4 on the back surface 3b of the phosphor layer 3. By setting the evaporation speed within an appropriate range, it is possible to form the joint surface of the metal layer 4 to the phosphor layer 3 into a coarse surface having a grain structure as mentioned in the above.

More specifically, in the present embodiment, the metal layer 4 was prepared as described in the following, for example. A resistance heating typed evaporation apparatus, for example, was used to evaporate a metal (Au in the present embodiment) constituting the metal layer 4 on the phosphor layer 3. The vacuum degree of the resistance heating typed evaporation apparatus was set to be in a range of $10^{-4}$ Pa to $10^{-1}$ Pa. The metal constituting the metal layer 4 was evaporated on the back surface 3b of the phosphor layer 3 at an evaporation speed in a range of 0.1 Å/second to 50 Å/second.

It has been confirmed by the inventors of the present application according to various experiments that it is impossible to form the coarse surface of the grain structure having the grains of a size in the above-mentioned range if the evaporation speed is slower than 0.1 Å/second or faster than 50 Å/second. Thereby, the evaporation speed was set in a range of 0.1 Å/second to 50 Å/second.

In the light source apparatus 1 of the present embodiment, the back surface of the metal layer 4 (the opposite surface to the joint surface to the phosphor layer 3) is adhered via an organic adhesive, an inorganic adhesive, low-melting glass or the like (not shown) to the base plate 5. Accordingly, the phosphor layer 3 and the metal layer 4 are mounted and fixed on the base plate 5.

Hereinafter, operations of the light source apparatus 1 having the above configuration will be described.

When a light beam emitted by the solid light source element 2 enters into the phosphor layer 3 through the incident surface (the outer surface 3a) of the phosphor layer 3, the incident light beam is used as the excitation light beam to excite atoms, ions, molecules and the like of the phosphor constituting the phosphor layer 3 into excitons.

Assuming that if the metal layer 4 is not joined to the phosphor layer 3, the excitons excited in the phosphor layer 3 return to the ground state via a non-radiation process to become heat (phonons) or return to the ground via a radiation process to become light (photons). The heat (phonons) generated in the non-radiation process will warm up the phosphor layer 3, and the light (photons) generated in the radiation process will be emitted through the outgoing surface (the outer surface 3a) of the phosphor layer 3 to the outside as a fluorescence beam.

However, as mentioned in the above, in the light source apparatus 1 of the present embodiment, the metal layer 4 is joined to the phosphor layer 3, and the metal constituting the metal layer 4 is selected from such sort of metals having a surface plasmon frequency equal to or close to the frequency of the fluorescence beam generated in the phosphor layer 3.

Therefore, in addition to the non-radiation process and the radiation process, there also occurs a surface plasmon process in which surface plasmon polaritons are generated according to the coupling of the excitons generated in a region close to the joint surface with the surface plasmon occurred in the joint surface between the phosphor layer 3 and the metal layer 4.

In this situation, the state density of the surface plasmon polaritons is extremely large around the surface plasmon frequency, and consequently, the generation speed of the surface plasmon polaritons via the surface plasmon process will be faster than the generation speed of the phonons via the non-radiation process or the generation speed of the photons via the radiation process. Therefore, in the behavior of the excitons in the phosphor layer 3, the surface plasmon process would become dominant over the non-radiation process and the radiation process to accelerate the generation of the surface plasmon polaritons.

The surface plasmon polaritons usually present a behavior in a non-radiation mode, however, it has been confirmed by the inventors of the present application according to various experiments that the surface plasmon polaritons can be converted into a light beam emitted out from the phosphor layer 3 through the outgoing surface (the outer surface 3a) if the joint surface of the metal layer 4 to the phosphor layer 3 is formed into a coarse surface.

Thus, if the joint surface of the metal layer 4 to the phosphor layer 3 is formed into the coarse surface having a grain structure as described in the above and the size of grains is set within the above-mentioned range, it is possible to effectively convert the surface plasmon polaritons into a light beam emitted out from the phosphor layer 3 through the outgoing surface (the outer surface 3a).

As above-mentioned, according to the light source apparatus 1 of the present embodiment, it is possible to convert the surface plasmon polaritons according to the surface plasmon process into a light beam emitted out from the phosphor layer 3 through the outgoing surface (the outer surface 3a).

Thus, in addition to the fluorescence beam generated from the excitons excited in the phosphor layer 3 via the radiation process, a light beam generated from the excitons via the surface plasmon polaritons in the surface plasmon process is beamed out from the phosphor layer 3. According thereto, compared with the case in which only the fluorescence beam generated in the phosphor layer 3 via the radiation process is emitted out from the phosphor layer 3, the light-emitting efficiency and the light-emitting intensity of the phosphor layer 3 are improved.

In the behavior of the excitons excited by the excitation light beam in the phosphor layer 3, the surface plasmon process is dominant over the non-radiation process and the radiation process, compared with the case in which the surface plasmon process does not occur (only the non-radiation process and the radiation process occur), it is possible to reduce the excitation density of the excitons in the phosphor layer 3. Consequently, it is possible to improve the upper limit of incident intensity of the excitation light beam possible to enter into the phosphor layer 3 without having the occurrence of saturation of the excitation density (the excitation saturation) in the phosphor layer 3. Thereby, by further improving the incident intensity of the excitation light beam (the light-emitting intensity of the solid light source element 2), it is possible to further improve the intensity of the light beam emitted out from the phosphor layer 3.

The effects mentioned above in the present embodiment will be described in more detail.

In the light source apparatus 1 of the present embodiment, if the light-emitting efficiency of the phosphor layer 3 is denoted by $\eta^*\_int$ and the heat generation rate of the phosphor layer 3 is denoted by $\eta^*\_heat$, then, they can be expressed by the following expressions (1) and (2), respectively.

$$\eta^*\_int = (kr+ksp)/(kr+knon+ksp) \quad (1)$$

$$\eta^*\_heat = knon/(kr+knon+ksp) \quad (2)$$

In the expressions (1) and (2), kr is a speed constant denoting the generation speed (the amount of photons generated per unit time) of the photons (the fluorescence beam) via the radiation process; knon is a speed constant denoting the generation speed of the phonons via the non-radiation process; and ksp is a speed constant denoting the generation speed of the surface plasmon polaritons via the surface plasmon process. However, if the surface plasmon process is not present, the light-emitting efficiency and the heat generation rate of the phosphor layer 3 are expressed by the expressions (1) and (2) with ksp set to zero, respectively.

It is obvious from the expressions (1) and (2) that it is possible to reduce the heat generation rate $\eta^*\_heat$ lower than the case where ksp=0 by making ksp greater (to generate more surface plasmon processes), and consequently, to improve the light-emitting efficiency $\eta^*\_int$ ($=1-\eta^*\_heat$) and the light-emitting intensity.

Figure 4:
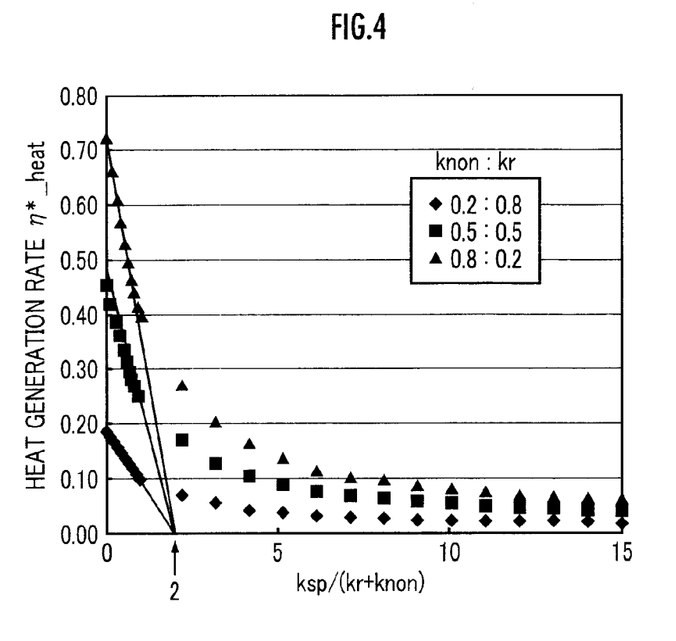
FIG. 4 is a graph illustrating light-emitting efficiencies by the phosphor layer in the light source apparatus illustrated in FIG. 1.

FIG. 4 illustrates a graph denoting a relationship between the ratio of ksp relative to (kr+knon) (=ksp/(kr+knon)) and the heat generation rate $\eta^*\_heat$ denoted by the expression (2). The graphs in FIG. 4 denote the relationship between ksp/(kr+knon) and $\eta^*\_heat$ when knon:kr=0.2:0.8, knon:kr=0.5:0.5, and knon:kr=0.8:0.2, respectively.

As illustrated by the graphs in FIG. 4, even though the ratio between knon and kr varies (and consequently, the light-emitting efficiency $\eta^*\_int$ varies), if ksp/(kr+knon) is equal to or greater than 2, then, the heat generation rate $\eta^*\_heat$ is reduced half of the case when ksp=0. However, it is desired that the heat generation rate $\eta^*\_heat$ should be as small as possible, therefore, it is considered that ksp/(kr+knon) should be equal to or greater than 10, for example.

In the light source apparatus 1 of the present embodiment, if the excitation density of the phosphor layer 3 (the amount of excitons generated in a unit volume per unit time) is denoted by $\rho^*$, then, $\rho^*$ in a stationary state where the excitation density is roughly constant (the temporal variation rate of $\rho^*$ is roughly zero) is represented by the following expression (3).

$$\rho^* = I/(kr+knon+ksp) \quad (3)$$

Kr, knon and ksp in the expression (3) hold the same meanings as those in the above expressions (1) and (2). I denotes the amount of photons of the excitation light beam entered into a unit volume of the phosphor layer 3 per unit time, which is equivalent to the incident intensity of the excitation light beam. However, if the surface plasmon process is not present, the excitation density of the phosphor layer 3 in the stationary state is represented by the expression (3) with ksp set to zero.

Figure 5:
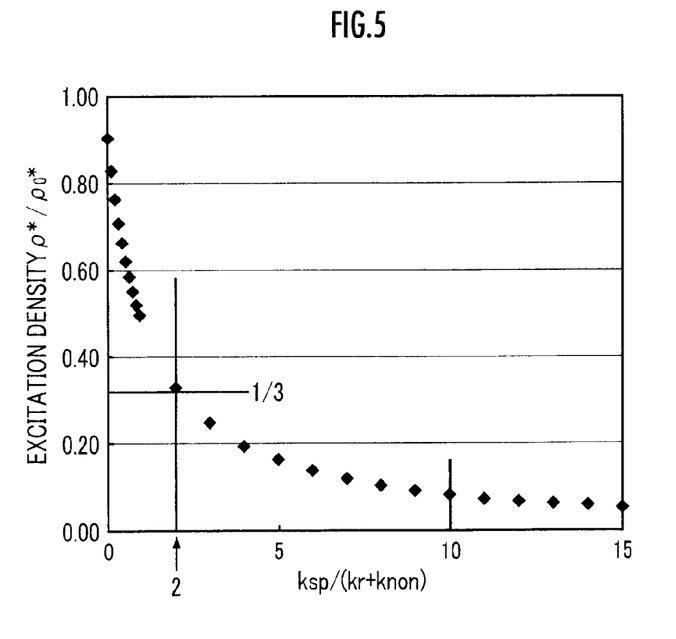
FIG. 5 is a graph illustrating heat generation rates by the phosphor layer in the light source apparatus illustrated in FIG. 1.

FIG. 5 illustrates a graph denoting a relationship between the ratio of ksp relative to (kr+knon) (=ksp/(kr+knon)) and the excitation density $\rho^*$ denoted by the expression (3). In the graph of FIG. 5, the vertical axis denotes a relative excitation density $\rho^*/\rho 0^*$ with respect to a reference excitation density $\rho 0^*$ (=I/(kr+knon)) when ksp=0.

It is obvious from the expression (3) and FIG. 5 that it is possible to reduce the excitation density $\rho^*$ lower than the case where ksp=0 by making ksp greater (to generate more surface plasmon processes) when the incident intensity of the excitation light beam to the phosphor layer 3 is constant (I is set constant), and consequently, to increase the upper limit of the incident intensity of the excitation light beam which brings the excitation density $\rho^*$ to saturation.

As illustrated by the graphs in FIG. 5, if ksp/(kr+knon) is equal to or greater than 2, then, the excitation density $\rho^*$ is reduced to one third of the case when ksp=0. However, it is desired that the excitation density $\rho^*$ should be as small as possible in order to increase the upper limit of the incident intensity of the excitation light beam, therefore, it is considered that ksp/(kr+knon) should be equal to or greater than 10, for example.

As described in the above, according to the light source apparatus 1 having the structure illustrated in FIG. 1, it is possible to inhibit the non-radiation process which converts the excitons into heat from occurring in the phosphor layer 3 and inhibit the excitation density from becoming saturated. According to the inhibition of the occurrence of the non-radiation process, it is not only possible to convert the energy of the excitation light beam entered into the phosphor layer 3 into a light beam emitted from the phosphor layer 3 via the radiation process and the surface plasmon process at high efficiency but also possible to improve the total intensity of the light beam emitted from the phosphor layer 3.

According to the reduction of the excitation density, it is possible to use the solid light source element 2 of a high output (having a high light-emitting intensity) to beam the excitation light beam of a high intensity into the phosphor layer 3 without having the excitation density to become saturated, and consequently, to further improve the intensity of the light beam emitted from the phosphor layer 3.

Since the heat generation rate of the phosphor layer 3 can be reduced by inhibiting the non-radiation process which converts the excitons into heat from occurring in the phosphor layer 3, it is possible to inhibit the phosphor layer 3 from being warmed up to give birth to a temperature rise.

In the present embodiment, a GaN light-emitting semiconductor element emitting a blue light beam is used as the solid light source element. If the wavelength of the fluorescence beam generated from the excitons in the phosphor layer 3 via the radiation process is set to vary from, for example, a wavelength of about 540 nm (the wavelength of green color) to a wavelength of about 640 nm (the wavelength of red color)

as described in the above, and if Au which has the plasmon wavelength equivalent to the wavelength of the fluorescence beam is used as the material of the metal layer 4, it is possible to make a light beam emit from the phosphor layer 3 from green color to red color in high efficiency. Thus, when the solid light source element 2 emits a light beam, according to the combination with the light beam emitted from the phosphor layer 3, it is possible to generate a white light beam of a good color rendering property. Thereby, the light source apparatus 1 of the present embodiment can be used as a white light source capable of outputting a white light beam of a good color rendering property in high efficiency.

Second Embodiment

Hereinafter, a light source apparatus 11 having a more detailed structure than the light source apparatus 1 illustrated in FIG. 1 will be described as a second embodiment with reference to FIG. 6.

Figure 6:
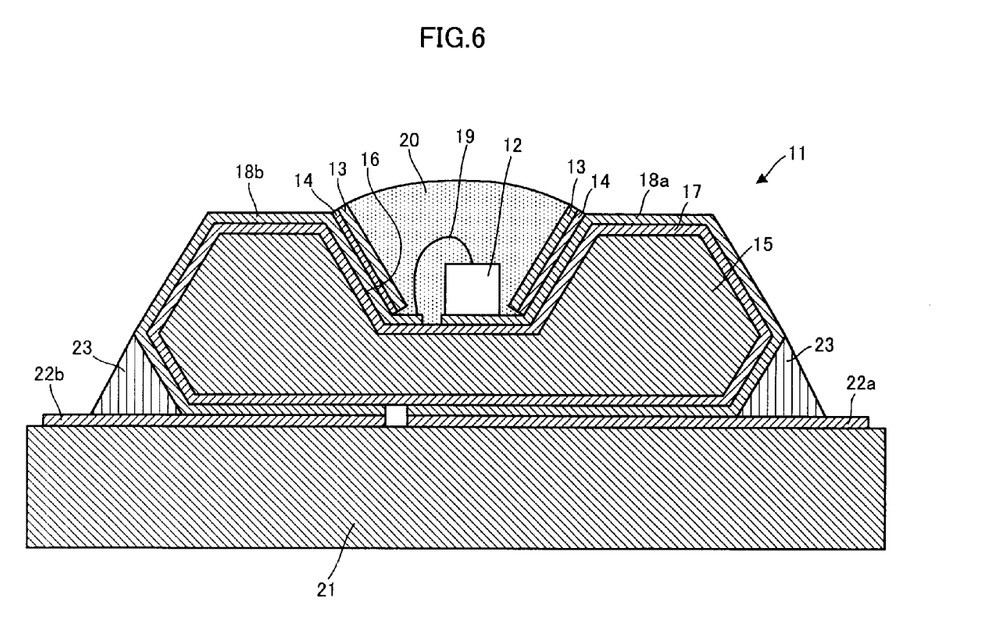
FIG. 6 is a cross sectional diagram illustrating a structure of a light source apparatus according to a second embodiment of the present invention.

The light source apparatus 11 illustrated in FIG. 6 includes a solid light source element 12, a phosphor layer 13, and a metal layer 14 equivalent to the solid light source element 2, the phosphor layer 3, and the metal layer 4 in the light source apparatus 1 illustrated in FIG. 1. In the light source apparatus 11, the solid light source element 12, the phosphor layer 13 and the metal layer 14 are mounted on a base plate 15.

It is preferable that the base plate 15 is composed of a material of a high thermal conductivity which can conduct easily the heat generated in the phosphor layer 13 via the metal layer 14, for example, a silicon substrate. An upper surface of the base plate 15 is formed with a recess portion 16 for disposing or mounting the solid light source element 12, the phosphor layer 13 and the metal layer 14.

The base plate 15 is prepared by performing anisotropic etching on the silicon substrate, for example, to form the recess portion 16. In the base plate 15 prepared by performing anisotropic etching on the silicon substrate, the surfaces of the recess portion 16 are smooth, enabling the heat from the phosphor layer 13 disposed in the recess portion 16 to be conducted to the base plate 15 easily, which will be described hereinafter.

The entire outer surface of the base plate 15 is formed into a silicon dioxide film 17 according to thermal oxidation. Patterned electrodes 18a and 18b are filmed over the silicon dioxide film 17 at an upper surface and a lower surface of the base plate 15, respectively. The electrodes 18a and 18b are electrically isolated from each other. The portions of the electrodes 18a and 18b at the upper surface and the lower surface of the base plate 15 are electrically conducted via the side surfaces of the base plate 15. The electrodes 18a and 18b at the upper surface extend to the bottom surface of the recess portion 16 along the side walls of the recess portion 16.

The solid light source element 12 is mounted on the bottom surface of the recess portion 16 in the base plate 15 with the silicon dioxide film 17 and the electrodes 18a and 18b formed on the outer surface thereof as described in the above. In the present embodiment, the solid light source element 12 is a light-emitting diode (LED chip) composed of, for example, a GaN (Gallium Nitride) light-emitting semiconductor element or the like which emits a blue light.

The solid light source element 12 is provided with an electrode terminal at the upper surface and an electrode terminal at the lower surface thereof. The electrode terminal at the lower surface is connected to the electrode 18a via die bonding. Thereby, according the die bonding, the electrode terminal at the lower surface of the solid light source element 12 is electrically conducted to the electrode 18a, and meanwhile, the solid light source element 12 is fixed on the base plate 15.

The electrode terminal at the upper surface of the solid light source element 12 is electrically connected to the electrode 18b via a bonding wire 19.

The phosphor layer 13 and the metal layer 14 are formed into films and have the same functions as the phosphor layer 3 and the metal layer 4, respectively, described in the first embodiment in the above. The phosphor layer 13 may be composed of the same material as that in the first embodiment, for example, from hydrogen-terminated porous silicon having a nanocrystalline silicon structure, and is prepared according to the production method described in the first embodiment.

The metal layer 14 may be composed of the same material as that in the first embodiment, for example, from Au. Similar to the metal layer 4 in the first embodiment, the metal layer 14 is set to have a thickness of at least 10 nm. Further, by evaporating the metal (Au in the present embodiment) constituting the metal layer 14 on the phosphor layer 13 according to the same approach as the first embodiment, the metal layer 14 is joined to the phosphor layer 13, and the joint surface of the phosphor layer 13 is formed into a coarse surface of a grain structure having the size of grains in a range of 10 nm to 100 nm.

After the metal layer 14 is joined to the phosphor layer 13, the joint layers are fixed on a side wall of the recess portion 16 with the metal layer 14 intervened between the side wall of the recess portion 16 formed in the base plate 15 and the phosphor layer 13. In the present embodiment, as illustrated by the drawing, the pair of the phosphor layer 13 and the metal layer 14 is fixed on each of two opposing surfaces of the side walls of the recess portion 16, respectively. For each pair of the phosphor layer 13 and the metal layer 14, the metal layer 14 is adhered to the side wall of the recess portion 16 formed in the base plate 15 via an adhesive member (not shown) such as an organic adhesive, an inorganic adhesive, low-melting glass or the like intervened between the metal layer 14 and the side wall of the recess portion 16. The metal layer 14 is electrically isolated from the electrodes 18a and 18b.

In the light source apparatus 11 of the present embodiment, after the solid light source element 12, the phosphor layer 13 and the metal layer 14 are mounted in the recess portion 16 formed in the base plate 15 as described in the above, a mold member 20 made of transparent resin is filled in the recess portion 16 and cured. Thereby, the solid light source element 12, the phosphor layer 13 and the metal layer 14 are molded in their entirety by the mold member 20.

Accordingly, the solid light source element 12, the phosphor layer 13, the metal layer 14, the base plate 15 and the mold member 20 are formed into an integral package. The package is mounted in its entirety on a circuit board 21 and fixed thereon.

The upper surface of the circuit board 21 is patterned with wiring patterns 22a and 22b. The package is mounted in its entirety on the circuit board 21 in such a way that the electrodes 18a and 18b at the lower surface of the base plate 15 in the package have contact and conduction with the wiring patterns 22a and 22b, respectively, and the electrodes 18a and 18b are connected to the wiring patterns 22a and 22b, respectively, by a connecting agent 23 such as reflowing a cream solder or the like. Thus, the package is mounted and fixed on the circuit board 21.

Hereinbefore, the structure of the light source apparatus 11 of the present embodiment has been described.

In the light source apparatus 11 of the present embodiment described above, when a drive voltage is applied to the solid light source element 12 to make the solid light source element 12 emit a light beam, a part of the light beam enters into each phosphor layer 13 as the excitation light beam. Herein, the behavior of the excitons in each phosphor layer 13 is subjected to the same processes occurred in the first embodiment, including the surface plasmon process.

Thus, in addition to a fluorescence beam generated from the excitons excited by the excitation light beam in the phosphor layer 13 via the radiation process, a light beam generated from the excitons via the surface plasmon polaritons according to the surface plasmon process emits from the outgoing surface (the surface opposite to the joint surface of the metal layer 14 in the two surfaces along the normal line of the phosphor layer 13).

The outgoing light beam travels through the mold member 20 together with a light beam emitted from the solid light source element 12 (the light beam which does not enter into the phosphor layer 13 but travels directly upward) and emits to the outside of the mold member 20. The color of the light beam emitted to the outside of the mold member 20 has a combination color combined from the color of the light beam emitted from the solid light source element 12 and the color of the light beam emitted from the phosphor layer 13 (the color of a light beam having a wavelength longer than the light beam emitted from the solid light source element 12).

In the present embodiment, similar to the first embodiment, the color of the light beam emitted from the solid light source element 12 is blue and the color of the outgoing light beam emitted from the phosphor layer 13 varies from green to red, thereby, the combination light beam has a white color.

Similar to the first embodiment, according to the light source apparatus 11 of the present embodiment, it is not only possible to generate the light beam emitted from the phosphor layer 13 from the excitation light beam entering into each phosphor layer 13 in high efficiency but also possible to improve the upper limit of the intensity of the excitation light beam possible to enter into the phosphor layer 13 without having the excitation saturation occurred in the phosphor layer 13.

Therefore, if an element capable of emitting a light beam of a high light-emitting intensity is used as the solid light source element 12, it is possible to generate a light beam of a high intensity emitted from each phosphor layer 13. Consequently, it is possible for the light source apparatus 11 to improve the entire intensity of the light beam (in the present embodiment, white light beam) emitted through the mold member 20 to the outside. Thus, it is possible to provide the light source apparatus 11 of a high output according to the present embodiment.

In addition to the inhibition of the occurrence of the non-radiation process in each phosphor layer 13, the heat generated via the non-radiation process in the phosphor layer 13 can be released to the base plate 15 effectively, it is possible to inhibit the phosphor layer 13 from being warmed up or inhibit the temperature of the phosphor layer 13 from rising.

In each of the embodiments described above, the incident surface and the outgoing surface of the phosphor layer 3 or the phosphor layer 13 are the same surface; however, it is acceptable that the incident surface and the outgoing surface are different from each other.

In each of the embodiments described above, a resistance heating typed evaporation apparatus is used to evaporate the metal layer 4 on the phosphor layer 3 or the metal layer 14 on the phosphor layer 13; however, it is acceptable to use herein a magnetron sputtering typed evaporation apparatus.

In each of the embodiments described above, the phosphor layer 3 or the phosphor layer 13 is composed of hydrogen-terminated porous silicon having a nanocrystalline silicon structure; however, it is also acceptable that the phosphor layer 3 or the phosphor layer 13 is composed of a phosphor prepared from rare-earth metal complex or transition-metal complex, various organic light-emitting materials, semiconductor micro particles such as CdSe, CdTe, ZnS and the like, or silicon nanoparticles and the like.

If the phosphor layer 3 or the phosphor layer 13 is composed of nanocrystalline silicon, for example, it is acceptable to deposit polysilicon on the metal layer 4 or the metal layer 14, and etch the polysilicon with an etching agent such as hydrofluoric acid, oxygen gas or the like to prepare the nanocrystalline silicon and use the prepared nanocrystalline silicon to make the phosphor layer 3 or the phosphor layer 13. It is also acceptable to depose a silicon dioxide film on the metal layer 4 or the metal layer 14 and ion-implanting silicon into the silicon dioxide film to prepare the nanocrystalline silicon and use the prepared nanocrystalline silicon to make the phosphor layer 3 or the phosphor layer 13.

In addition to a semiconductor light-emitting element, for example an inorganic or organic EL light source, or a semiconductor laser or the like may be used as the solid light source element 2 or the solid light source element 12.

In each of the embodiments described above, the color of light beam emitted from the solid light source element 2 or the solid light source element 12 is described as blue; however, the light beam emitted from the solid light source element 2 or the solid light source element 12 is not limited to the wavelength of a blue color. For example, it is acceptable that the light beam emitted from the solid light source element 2 or the solid light source element 12 is of a purple color or a wavelength in ultraviolet range.

What is claimed is:

1. A light source apparatus comprising:
   a solid light source element which emits a light beam of a predefined wavelength,
   a phosphor layer which is subjected to the light beam emitted from the solid light source element as an excitation light beam and is excited by the incident excitation light beam to generate a fluorescence beam of a longer wavelength than the excitation light beam and emit the fluorescence beam to the outside, and
   a metal layer joined to a predefined surface among outer surfaces of the phosphor layer for converting excitons excited in the phosphor layer close to the predefined surface into a light beam via surface plasmon polaritons, the outer surfaces of the phosphor layer including an incident surface of the excitation light beam, an outgoing surface of the fluorescence beam, and the predefined surface which is different than the incident surface and the outgoing surface,
   wherein the light beam converted from the excitons via the surface plasmon polaritons is emitted out of the outgoing surface of the phosphor layer together with the fluorescence beam.

2. The light source apparatus according to claim 1, wherein the phosphor layer is composed of nanocrystalline silicon.

3. The light source apparatus according to claim 2, wherein the phosphor layer is composed of the nanocrystalline silicon which is prepared by anodizing a silicon substrate.

4. The light source apparatus according to claim 2, wherein the phosphor layer is composed of the nanocrystalline silicon which is prepared by etching a polysilicon.

5. The light source apparatus according to claim 2, wherein the phosphor layer is composed of the nanocrystalline silicon which is prepared by ion-implanting silicon into a silicon dioxide film.

6. The light source apparatus according to claim 1, wherein the metal layer is composed of such sort of metal that the frequency of a surface plasmon generated at a joint surface of the metal layer to the phosphor layer is equivalent to the frequency of the fluorescence beam.

7. The light source apparatus according to claim 1, wherein the joint surface of the metal layer to the phosphor layer is a coarse surface.

8. The light source apparatus according to claim 7, wherein the metal layer is joined to the phosphor layer by evaporating a metal constituting the metal layer on the phosphor layer.

9. The light source apparatus according to claim 1, wherein
the solid light source element is mounted on a bottom surface of a recess portion formed in a base plate, and
the phosphor layer and the metal layer are fixed on a wall surface of the recess portion formed in the base plate with the metal layer intervened between the phosphor layer and the base plate.

10. The light source apparatus according to claim 1, wherein the metal layer is joined to the phosphor layer such that the phosphor layer is disposed between the light beam emitted by the solid light source element and the metal layer.

11. The light source apparatus according to claim 1, wherein the predefined surface of the phosphor layer is opposite from the incident surface and the outgoing surface.

\* \* \* \* \*